US009265184B2

(12) United States Patent
Hamouz et al.

(10) Patent No.: US 9,265,184 B2
(45) Date of Patent: Feb. 16, 2016

(54) FLUID CONDUIT THROUGH RF SHIELD

(71) Applicant: ETS-LINDGREN INC., Wood Dale, IL (US)

(72) Inventors: Michael G. Hamouz, Streamwood, IL (US); Paul V. Kolobayev, Buffalo Grove, IL (US); Joseph C. Weibler, West Chicago, IL (US)

(73) Assignee: ETS-Lindgren Inc., Wood Dale, IL (US)

( * ) Notice: Subject to any disclaimer, the term of this patent is extended or adjusted under 35 U.S.C. 154(b) by 142 days.

(21) Appl. No.: 14/085,551

(22) Filed: Nov. 20, 2013

(65) Prior Publication Data

US 2014/0138144 A1    May 22, 2014

Related U.S. Application Data

(60) Provisional application No. 61/728,678, filed on Nov. 20, 2012.

(51) Int. Cl.
*H05K 9/00* (2006.01)

(52) U.S. Cl.
CPC .................................. *H05K 9/0018* (2013.01)

(58) Field of Classification Search
CPC .................................................. H05K 9/0018
USPC .......................................................... 174/360
See application file for complete search history.

(56) References Cited

U.S. PATENT DOCUMENTS

| | | | | |
|---|---|---|---|---|
| 7,728,590 | B2 * | 6/2010 | Eberler et al. | 324/318 |
| 9,013,185 | B2 * | 4/2015 | Brown et al. | 324/309 |
| 2006/0038566 | A1 * | 2/2006 | Kimmlingen et al. | 324/318 |
| 2010/0096261 | A1 * | 4/2010 | Hoffman et al. | 204/298.08 |

* cited by examiner

*Primary Examiner* — Timothy Thompson
*Assistant Examiner* — Charles Pizzuto
(74) *Attorney, Agent, or Firm* — Cherskov Flaynik & Gurda, LLC

(57) ABSTRACT

The invention provides a system for providing passage of fluid lines through an RF shield, the device comprising an RF shield having external and internal surfaces; a channel defined by the RF shield and extending from the external surface to the internal surface of the RF shield; a hollow cylinder rotatably communicating with said channel and extending substantially the length of the channel; a longitudinally extending region of said cylinder defining a gap adapted to receive a fluid conduit; mounting plates attached to the external surface and the internal surfaces of the RF shield; a movable member having a handle, the movable member attached to either end of the channel, the handle in slidable communication with the mounting plate so as to slide about the periphery of the plate; and a depending end of the handle rigidly attached to the cylinder which in turn is in rotatable communication with the circular plate such that the handle can be manipulated to a first position to allow loading of the conduit into the cylinder and whereby the handle can be manipulated to a second position to prevent unloading of the conduit from the cylinder.

9 Claims, 5 Drawing Sheets

FLUID CONDUIT THROUGH RF SHIELD

CROSS-REFERENCE TO RELATED APPLICATIONS

This Patent Application claims priority to U.S. Provisional Patent Application 61/728,678 filed on Nov. 20, 2012.

BACKGROUND OF THE INVENTION

1. Field of the Invention

The present invention relates to a device for facilitating fluid flow to and from an MRI enclosure, and more specifically, the present invention relates to an intravenous conduit channel to facilitate intravenous treatment of patients positioned within MRI enclosures.

2. Background of the Invention

MRI technology requires a pristine electromagnetic radiation environment to produce relevant images. Otherwise, stray radiation (such as that emanating from electric motors found in elevators, radio transmitters and other transmitters, equipment, passing vehicles, etc.) will create "noise" on diagnostic images.

Elaborate enclosures are designed to prevent the aforementioned noise from reaching MRI equipment. These enclosures include door closing and sealing mechanisms to eliminate radiation encroachment into the enclosure during critical imaging periods.

However, a need exists in the art for a device which allows fluid transfer in and out of an MRI enclosure without compromising the electromagnetic shield the enclosure embodies. The device should be easy to operate by medical personnel without the need for specialized training. Also, the device should be easily integrated with existing MRI enclosures.

SUMMARY OF INVENTION

An object of the invention is to provide a channel adapted to removably receive an elongated substrate (such as an optical fiber, a fluid conduit (be it flexible or rigid) such as a gas line or liquid line, or an observation tube) which extends between an exterior and an interior of an MRI enclosure. An embodiment of the invention accommodates any conduit which, in the case of MRI applications, transports matter embodying a conductance of less than 100 siemens/m.

Another object of the invention is to provide a device for facilitating fluid transfer between the exterior and interior of an MRI enclosure. A feature of the invention is a passageway adapted to first receive a fluid conduit, then electrically isolate a fluid conduit within a wall of the enclosure. An advantage of the invention is that the invention's ability for receiving and isolating of the conduit is reversible, such that the conduit can be as readily removed from within the wall of the enclosure.

Briefly, the invention provides a system for providing passage of fluid and fluid lines through an RF shield, the device comprising an RF shield having external and internal surfaces; a channel defined by the RF shield and extending from the external surface to the internal surface of the RF shield; a hollow cylinder rotatably communicating with said channel and extending substantially the length of the channel; a longitudinally extending region of said cylinder defining a gap adapted to receive a fluid conduit; mounting plates attached to the external surface and the internal surfaces of the RF shield; a movable member having a handle, the movable member attached to either end of the channel, the handle in slidable communication with the mounting plate so as to slide about the periphery of the plate; and a depending end of the handle rigidly attached to the cylinder which in turn is in rotatable communication with the circular plate such that the handle can be manipulated to a first position to allow loading of the conduit into the cylinder and whereby the handle can be manipulated to a second position to prevent unloading of the conduit from the cylinder.

BRIEF DESCRIPTION OF DRAWING

The invention together with the above and other objects and advantages will be best understood from the following detailed description of the preferred embodiment of the invention shown in the accompanying drawings, wherein.

DETAILED DESCRIPTION OF THE INVENTION

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
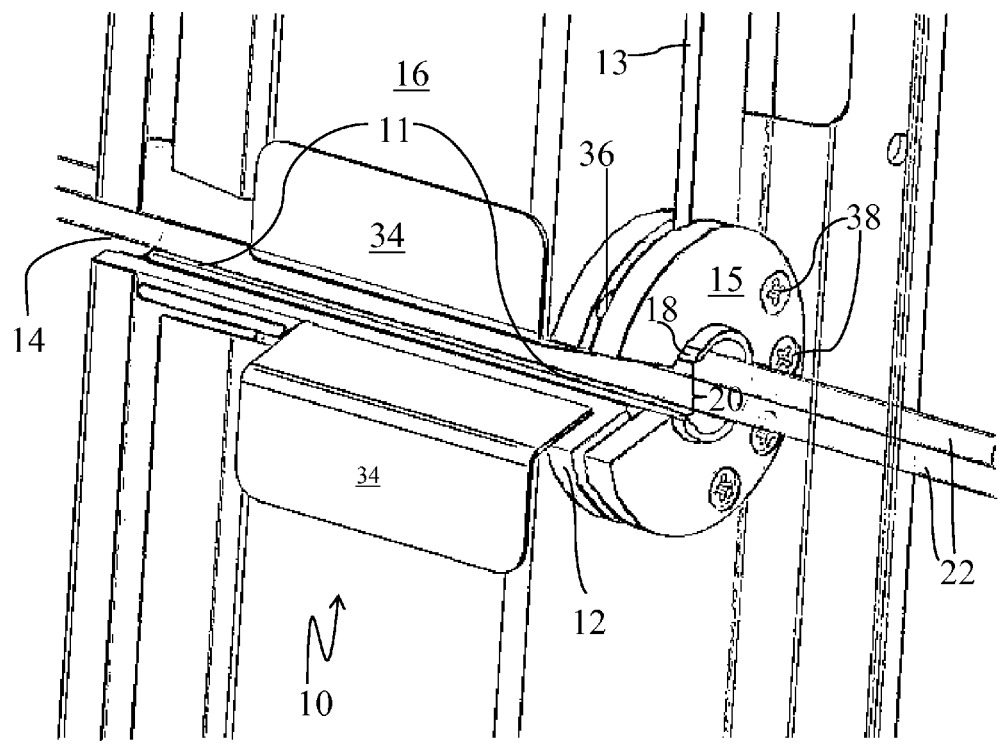
FIG. 1 depicts a device adapted to receive a fluid conduit; in accordance with features of the invention.
Figure 2:
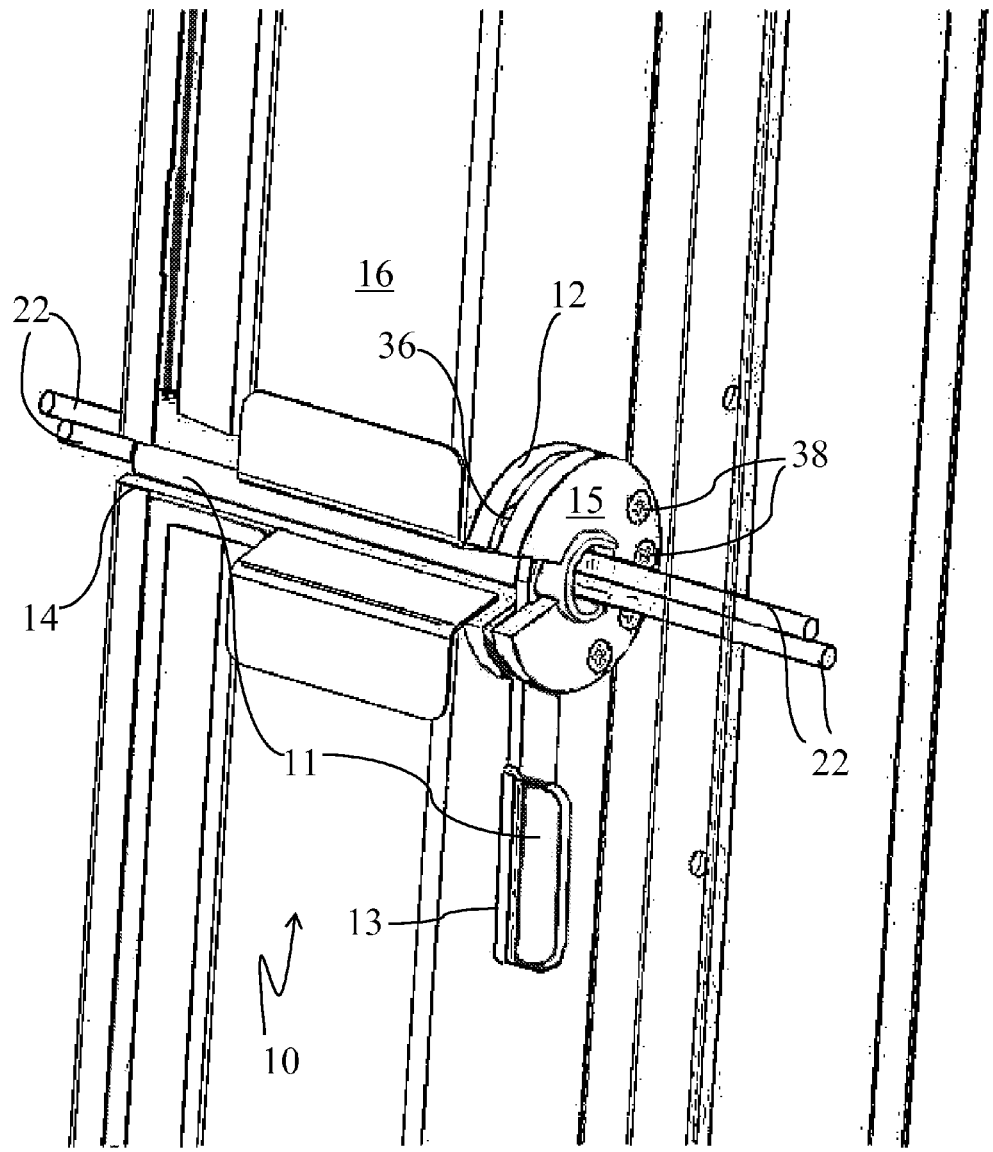
FIG. 2 depicts the device shown in FIG. 2, but in this configuration enclosing a fluid conduit within a channel, in accordance with features of the present invention.

FIGS. 1 and 2 illustrate the invented device, designated as numeral 10 in its opened and closed configurations, respectively. The device 10 comprises a movable member 11 actuated by a handle 13 positioned at either end of a channel 14 extending transversely through an RF shield 16. In one embodiment, the handle 13 is acted upon by a user's hand. In other embodiments, the handle 13 is a mounting point for mechanical actuation means.

The handle 13 is slidably received by an annular space formed by coaxially arranged mounting plates. A first mounting plate 12 is rigidly attached to the channel 14 while a second mounting plate 15, is axially separated from the first mounting plate 12 at least a distance to accommodate the thickness of the handle 13 and the action of the handle sliding about the periphery of the plate 15. This distance is maintained with a plurality of fasteners 38 whereby the fasteners pass through transverse apertures formed in the second mounting plate 15 and are matingly received by threaded apertures 36 formed in the first mounting plate 12, the threaded apertures coaxially arranged with the transverse apertures. These fasteners rigidly reversibly attach the second mounting plate 15 to the first mounting plate in an area between the plates not traversed by the sliding handle. This area is generally diametrically opposite that annular space between the plates through which the handle traverses.

A proximal end (which is depicted in FIG. 1 as the depending end) of the handle 13 is rigidly attached to a notched cylinder 18, which in turn is in rotatable communication with the channel 14. The mounting plates 12, 15 and the cylinder 18 are coaxially aligned with each other.

The channel 14 defined by the RF shield partially encircling it, is adapted to receive the cylinder 18 so as to enable the cylinder to rotate about both its longitudinal axis and the longitudinal axis of the channel 14. In the embodiment shown, the longitudinal axis of the cylinder 18 is generally perpendicular to the longitudinal axis of the door jamb. Therefore, the longitudinal axis of the cylinder, and therefore the cylinder, extends in a transverse fashion through the RF shield.

Longitudinally extending regions of the cylinder define a notch 20. The notch 20 is adapted to receive one or a plurality of intravenous lines 22, electrical lines, liquid lines, gas lines, etc. so as to allow the lines to extend uninterrupted from outside the RF shield to the interior of an enclosure defined by the RF shield. The lines are loaded into the cylinder when the device is in its open position (FIG. 1) which is to say when the cylinder notch 20 is facing outwardly toward the opening of the channel 14 defined by the RF shield. The lines are enveloped by the cylinder 18 when nested in the cylinder and the cylinder is rotated by the handle 13 such that solid portions of the cylinder face outwardly toward the opening of the channel 14.

Figure 3:
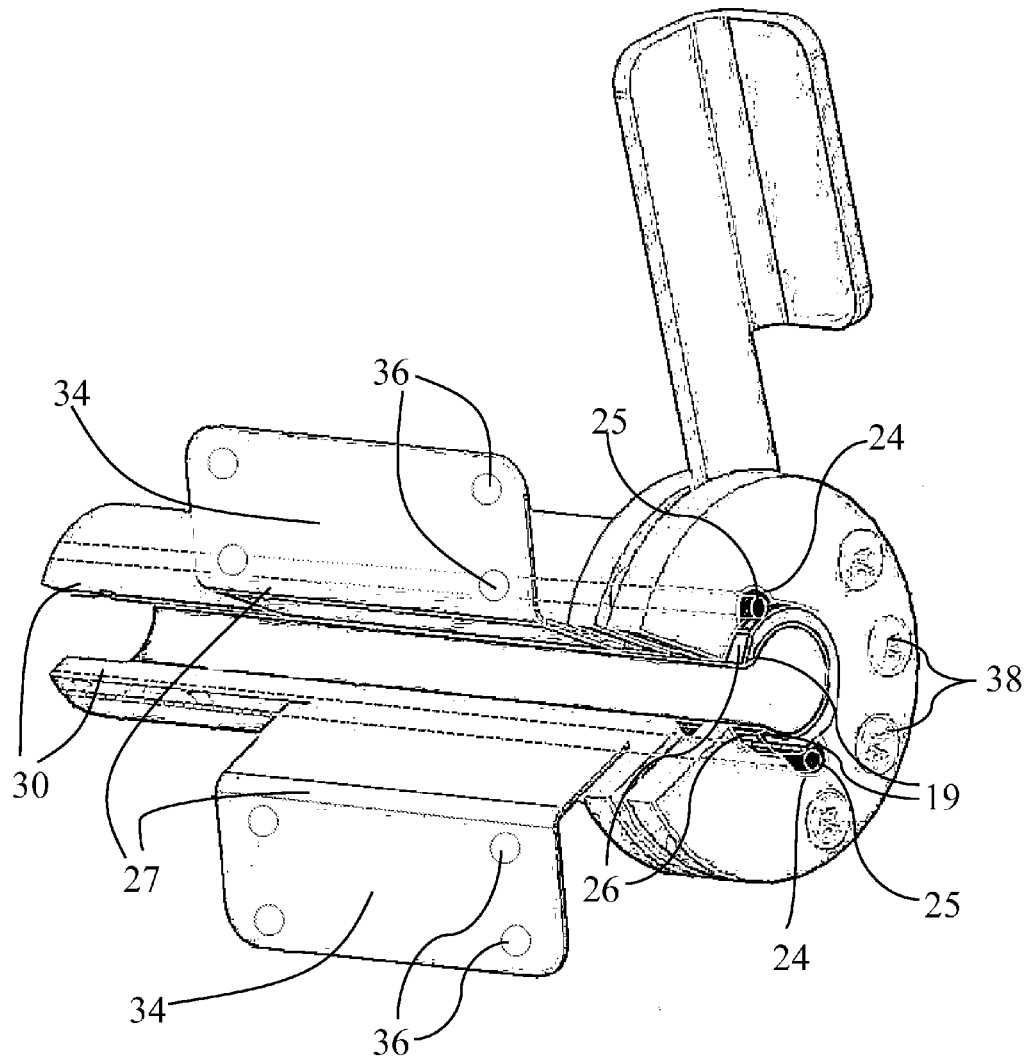
FIG. 3 is a perspective view of the device, in accordance with features of the present invention.

FIG. 3 is a perspective view of an embodiment of the device 10. Depicted in this view is a plurality of longitudinally extending grooves 24 formed into the channel 14. These grooves are each adapted to receive a spiral gasket 25. Such gaskets are flexible elongated substrates wound out of electrically conductive metal so as to confer both compression resistance and electromagnetic shielding. They are provided in a wide range of diameters. A myriad of spiral gaskets are commercially available, including Spira-Shield™, manufactured by Spira Manufacturing Corporation, North Hollywood, Calif.

Once positioned (and held in place either via friction fit within the channel or due to a sandwiching effect between the channel and the cylinder), the spiral gaskets 25 provide a wave guide beyond cutoff which extends substantially the entire length of the channel 14. A feature of the gaskets is that a portion of their peripheries are in physical contact with the cylinder to affect the wave guide beyond cutoff. As such, those portions extend medially so as to protrude out of the groove 24 and therefore beyond the inwardly facing surface of the channel 14 so as to contact the cylinder along substantially the entire length of the cylinder to confer an RF seal.

FIG. 3 also depicts peripheral regions of the lip 19 of the notched cylinder 18, those peripheral regions defining a ramp 26 which directly opposes inwardly facing surfaces of the channel 14 (as labeled in FIG. 2). This ramp provides a means for facilitating movement of the cylinder over the aforementioned protruding portions of the spiral gaskets. Generally the ramp 26 comprises a flat surface originating from an inner edge of the notch 20 to a region of the outside surface of the cylinder that is displaced along a radial arc of the cylinder. This results in the flat surface extending angularly away from the notch 20.

A myriad of lines are accommodated by the invention, including but not limited to optical fibers, liquid lines such as cryogenic and intravenous lines, gas lines (e.g., oxygen gas and nitrogen feed lines) and combinations thereof. Solid lines (for example electrical wiring) are also accommodated by the device. Generally, when installing the device within an RF enclosure wall, conductance values of the fibers, conduits, wires or other elongated substrates nesting within the device should not exceed those values which would cause RF leakage into the enclosure at a level which would compromise the testing or diagnostic imaging going on there.

Figure 4:
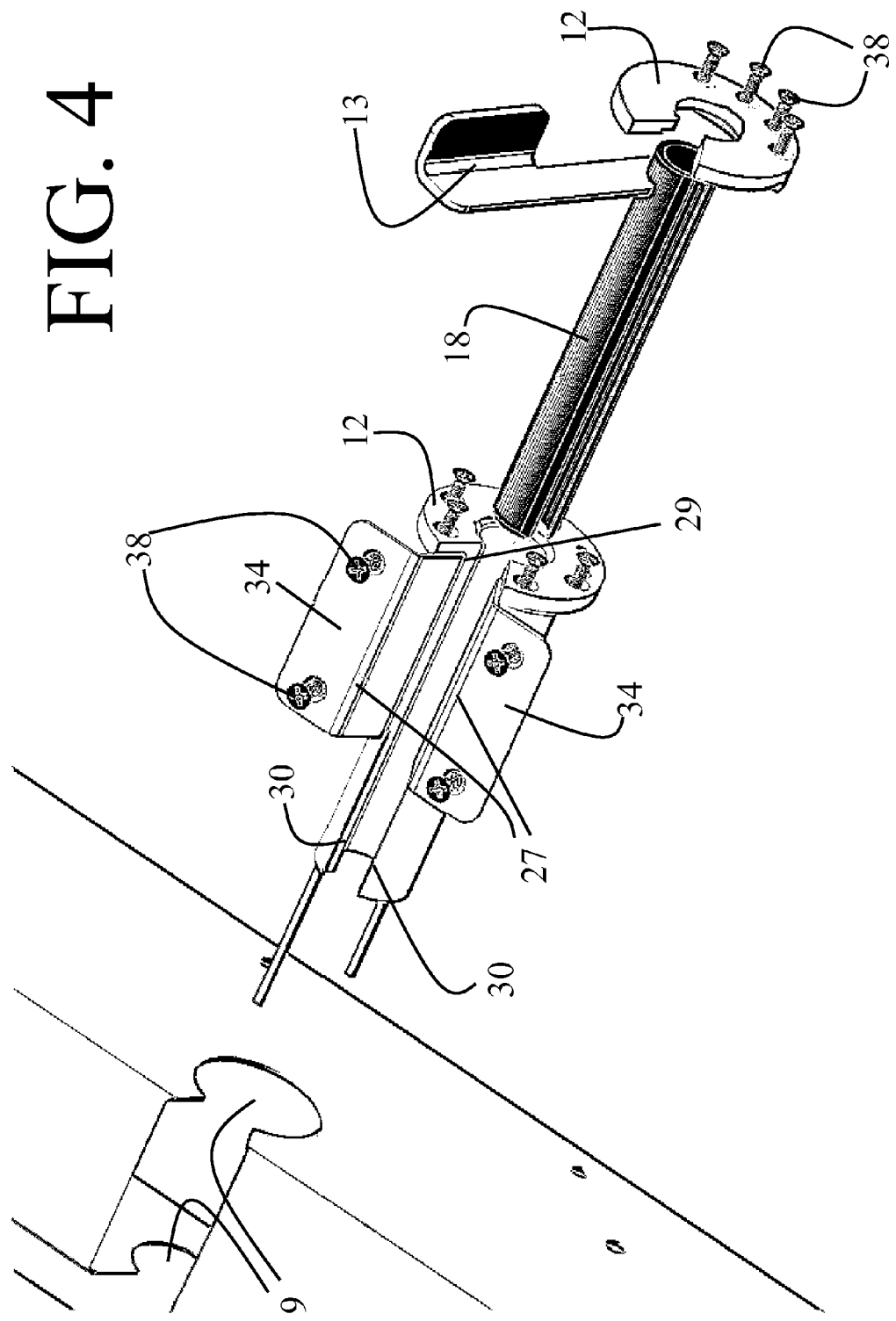
FIG. 4 is a first exploded view of the device, in accordance with features of the present invention.

As further depicted in FIG. 3 and FIG. 4, the device comprises a plurality of mounting flanges 27, each flange generally defined by two flat plates at right angles to each other. Distal edges 29 of one of the plates of each mounting flange are affixed (either permanently or reversibly) to portions of the device forming a lip 30 of the channel 14 so that the two mounting flanges so arranged define an access trough to the channel. In an embodiment of the invention, a flat surface 34 of one mounting flange is co-planar with a flat surface of a second mounting flange. The plane resulting from this configuration is mounted flush with any door jamb defined by the RF enclosure. However, in more custom installations, the mounting flanges are not necessarily co-planar.

The device can be incorporated in new construction situations, but can also be utilized to retrofit already existing MRI enclosures and door jambs. Regions of the mounting flanges define a plurality of transversely extending apertures 36 adapted to removably receive a plurality of fasteners 38.

Thus, the invention can be utilized in retrofitting existing door jambs of already built MRI enclosures. Attention is now directed to exploded views (FIGS. 4 and 5) of the device. As can be seen in FIG. 4, in an embodiment of the invention, the channel 14, the first circular plate 12, and the flanges 27 are integrally molded together to form a rigid structure. In other embodiments the flanges are reversibly attached to the channel to allow for modularity in replacing worn parts.

Figure 5:
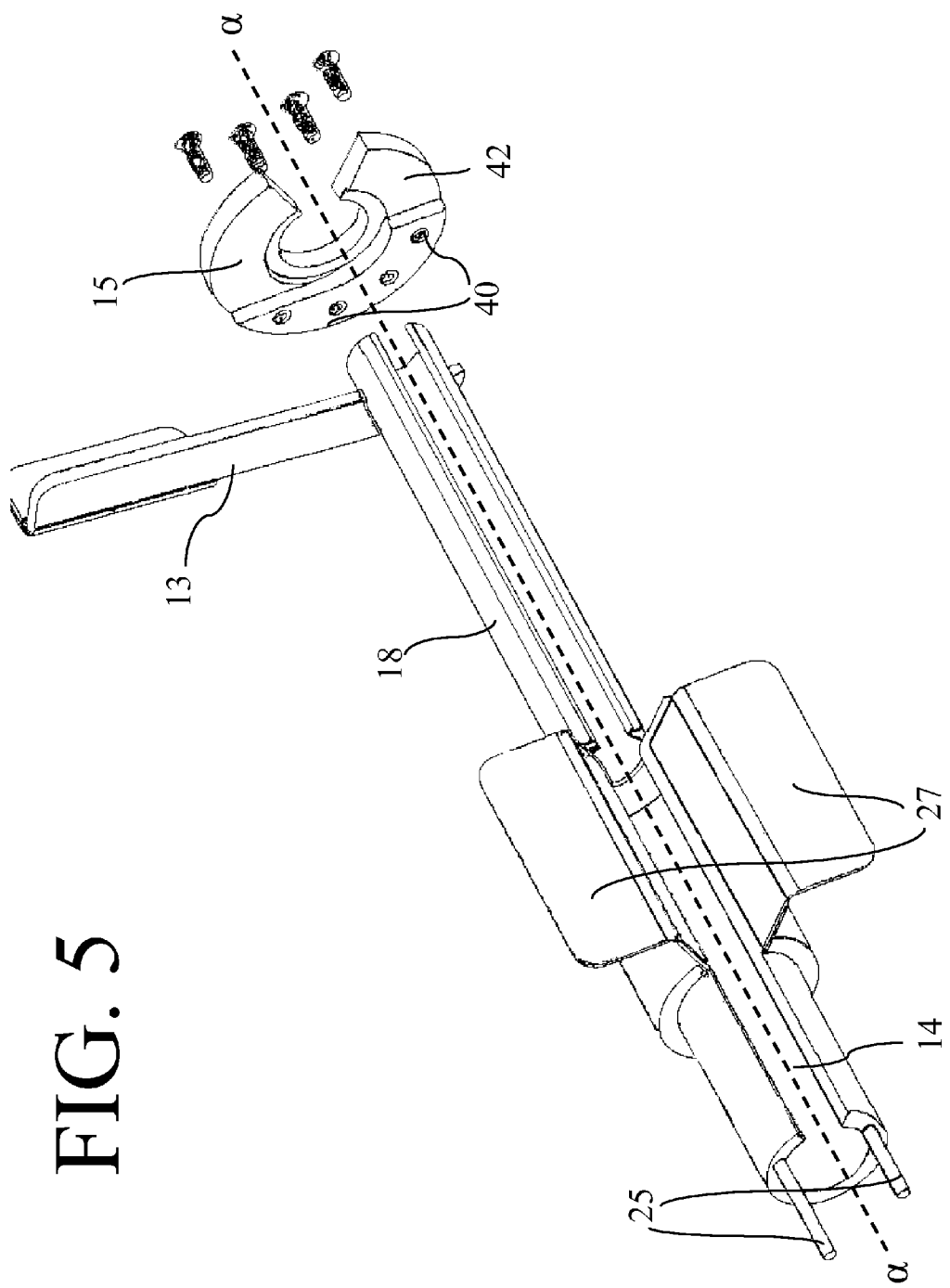
FIG. 5 is a second exploded view of the device, in accordance with features of the present invention.

The first circular plate 12 is not shown in FIG. 5 to clarify how the slotted cylinder 18 is slidably received by the channel 14. In operation, the retrofitting process first involves positioning the channel 14 into a previously formed void in a door jamb or void 9 in an EMF shield. Once positioned, the fasteners 38 are utilized to secure the mounting flanges (previously attached to the channel via welds, drop-forging or fasteners) and the first mounting plate 12 to the periphery of the void in the door jamb.

As noted previously, the handle 13 is rigidly attached to the notched cylinder 18. This combination is placed within the channel as a second step in the retrofit process. No fasteners are used to effectuate this placement inasmuch as the cylinder 18 must rotate freely within the channel 14 but for a slight brushing interaction with the spiral gaskets 25 protruding from their grooves 24 in a direction toward the longitudinal axis a of the device.

As a third and final step in the installation process, the rotating cylinder is held in place within the channel 14 with the coaxial alignment and installation of the second plate 15 over the first plate 12. As discussed supra, the second plate 15 is secured to the assembly via fasteners, 38 along regions 40 of the second plate that are diametrically opposed to the region defining the annular space between the first and second plates. Optionally, that diametrically opposed region 40 projects axially from a first inwardly facing surface 42 of the second plate and toward the first plate. This confers additional width to the annular space through which the handle 13 traverses its arc.

It is to be understood that the above description is intended to be illustrative, and not restrictive. For example, the above-described embodiments (and/or aspects thereof) may be used in combination with each other. The fluid conduit passageway may be straight or may be curved. Similarly, the fluid conduit may be reversibly deformable so as to follow the passage defined by the conduit passageway. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property or privilege is claimed is defined as follows:

1. A device for providing passage of elongated substrates through an RF shield, the device comprising:
   a. an RF shield having external and internal surfaces;
   b. a channel defined by the RF shield and extending from the external surface to the internal surface of the RF shield;
   c. a hollow cylinder rotatably communicating with said channel and extending substantially the length of the channel;
   d. a longitudinally extending region of said cylinder defining a gap adapted to receive the substrates;
   e. mounting plates attached to the external surface and the internal surfaces of the RF shield;
   f. a movable member having a handle, the movable member attached to either end of the channel, the handle in slidable communication with the mounting plate so as to slide about the periphery of the plate; and
   g. a depending end of the handle rigidly attached to the cylinder which in turn is in rotatable communication with the circular plate such that the handle can be manipulated to a first position to allow loading of one of the substrates into the cylinder and whereby the handle can be manipulated to a second position to prevent unloading of the loaded substrate from the cylinder.

2. The device as recited in claim 1 wherein the substrate is nonferrous.

3. The device as recited in claim 1 wherein the substrate is ferrous.

4. The device as recited in claim 1 wherein the device is removably attached to the RF shield.

5. The device as recited in claim 1 wherein said hollow cylinder comprises electrically conductive material.

6. The device as recited in claim 1 wherein the substrate is a conduit adapted to receive a fluid.

7. The device as recited in claim 1 wherein the substrate is an optical fiber.

8. The device as recited in claim 1 wherein the handle is actuated by a person's hand.

9. The device as recited in claim 1 wherein the cylinder is actuated remotely.

* * * * *